United States Patent
Rich

(10) Patent No.: US 7,484,782 B2
(45) Date of Patent: Feb. 3, 2009

(54) MULTI-AXIS PICK AND PLACE ASSEMBLY

(75) Inventor: Donald S. Rich, Long Valley, NJ (US)

(73) Assignee: Intellepro, Inc., Hampton, NJ (US)

( * ) Notice: Subject to any disclaimer, the term of this patent is extended or adjusted under 35 U.S.C. 154(b) by 400 days.

(21) Appl. No.: 11/212,992

(22) Filed: Aug. 26, 2005

(65) Prior Publication Data
US 2007/0059149 A1 Mar. 15, 2007

(51) Int. Cl.
B66C 3/00 (2006.01)

(52) U.S. Cl. .................. 294/64.1; 74/424.6; 414/752.1

(58) Field of Classification Search ............. 414/752.1, 414/627; 29/740; 294/64.1; 74/424.6, 490.01, 74/440, 446; 901/17, 18
See application file for complete search history.

(56) References Cited
U.S. PATENT DOCUMENTS

| | | | |
|---|---|---|---|
| 5,979,904 A | 11/1999 | Balsells | |
| 6,145,901 A | 11/2000 | Rich | |
| 6,464,069 B1 | 10/2002 | Rich et al. | |
| 6,491,587 B1 | 12/2002 | Rich | |
| 6,851,914 B2 * | 2/2005 | Hirata | 414/627 |

OTHER PUBLICATIONS

BAL Seal Engineering's PN-258A BALTM SEALS Catalogue, www.balseal.com/pdfs/PN-258.pdf.
BAL Seal Engineering's Rotary Seal Catalogue DM-5, "Solutions for rotary applications: High performance PTFE rotary lip seals, Custom engineered," www.balseal.com/pdfs/RotaryCatalog.pdf.
BAL Seal Engineering's Reciprocating Seal Catalogue DM-6, "Sealing Solutions for Reciprocating and Static Applications," www.balseal.com/pdfs/DM-6.pdf.
Bal Seal PTFE Seals: PTFE sealing solutions (overview), www.balseal.com/products/ptfe_seals.jsp, Jan. 11, 2005.
THK, "Ball-Screw Spline," www.thk.com/archive_file/technical_dl/pdf_en/D248-257.pdf.
ABTech Inc., Z-Theta Air Bearing Stage, www.abtechmfg.com/ztheta.html, Dec. 10, 2004.
Rockwell Automation, Anorad XY Gantry Products for Precision Motion, www.rockwellautomation.com/anorad/products/gantryproducts/valueadded/z_t.html, Dec. 10, 2004.
Parker Automation, High Precision Construction: Electomechanical Positioning Systems, www.daedalpositioning.com/Products/High_Precision_Contents/High_Precision_Technologies/High_Precision_Construction/high_precision_construction.html, Jan. 11, 2005.
Polyplastics, Kinds of gears, www.polyplastics.com/en/support/tech/gear/gear.html, Jan. 11, 2005.
IntellePro, Inc., Pick and Place Heads Custom Configured for Optimum Throughput, www.intellepro.com, Feb. 3, 2005.

* cited by examiner

*Primary Examiner*—Donald Underwood
(74) *Attorney, Agent, or Firm*—Cowan, Liebowitz & Latman, P.C.

(57) ABSTRACT

A pick and place assembly for picking up and positioning an article wherein a hollow spindle carrying a head for receiving vacuum for picking up an article, via a vacuum directed through the spindle, is housed within a hollow spindle housing and a sealing assembly is situated between the spindle housing and the spindle for directing the vacuum through the spindle as the spindle is driven by a driving assembly.

34 Claims, 3 Drawing Sheets

MULTI-AXIS PICK AND PLACE ASSEMBLY

BACKGROUND OF THE INVENTION

This invention relates to transporting and positioning of small articles and, in particular, to a pick and place assembly capable of multi-axial motion.

Assemblies for transporting and positioning articles and components of various articles are used in various applications. For example, in a semiconductor industry, these assemblies are used to transport semi-conductor chips from one location to another. In most applications, particularly in the electronics and semiconductor manufacturing industries, high speed and precision of the pick and place assemblies are essential. In particular, a pick and place assembly must be able to transport the articles from one place to another at high speed without damaging the article and to position the article with very high-precision at its destination.

Conventional pick and place assemblies typically employ a pick and place head installed and traveling on a gantry. The pick and place head includes a hollow cylindrical spindle coupled with a vacuum delivery system at one end and a vacuum cup at its other end. Vacuum delivered through the spindle to the vacuum cup by the vacuum delivery system enables the cup to pick up, or collect, an article to be transported. The spindle is also coupled to a driving means for linearly moving the spindle along a Z-axis so as to allow the vacuum cup to approach the article so as to pick it up and to withdraw after placing the article. The spindle may also be coupled to a second driving means which rotates the spindle, i.e. θ-motion, so as to properly position the article before being placed at its destination.

In order to create linear and rotary motions of the spindle, conventional pick and place heads have employed ball screw drives, pneumatic cylinder drives or linear motors. In addition, to account for the axial and rotary motions of the spindle, the conventional vacuum delivery systems have typically employed coiled or looped tubing and rotating union fittings.

Conventional pick and place assemblies suffer from a number of disadvantages, including excessive size and weight, programming and control problems and premature failure. In particular, ball screw drives used in conventional pick and place assemblies to create the linear and/or rotary motions of the spindle considerably add to the excessive size of the assemblies, while the linear motors significantly increase the weight of the pick and place assemblies, making such assemblies difficult to install and move on the gantry. The pneumatic cylinder drives, also commonly used for driving the spindle of the pick and place head, are often difficult to program and control. Moreover, the axial and rotary movement of the spindle in a conventional pick and place assembly often causes a collapse or cracking of the tubing providing the vacuum and a premature failure of the vacuum delivery system.

Another problem experienced by conventional pick and place assemblies is a descent, or free fall, of the spindle if power failure occurs. Such free fall of the spindle can result in damage to the spindle and other parts of the pick and place assembly, requiring costly repairs.

All of the above disadvantages have a significant effect on the speed, accuracy and the operating life of the conventional pick and place assemblies. It is therefore an object of the present invention to provide a pick and place assembly which integrates linear and rotary motions in a compact unit which can be easily mounted on the conventional gantry.

It is a further object of the present invention to provide a pick and place assembly with an improved vacuum delivery system which does not require coiled or looped tubing.

It is a further object of the present invention to provide a pick and place assembly which provides protection against the free fall of the spindle in cases of power failure.

SUMMARY OF THE INVENTION

In accordance with the embodiments of the invention disclosed hereinafter, the above and other objectives are realized in a pick and place assembly for picking up and positioning an article, in which a hollow spindle housing is adapted at one end to be connected to a vacuum source and a hollow spindle is housed in the spindle housing. The spindle is adapted at one end to receive a head for picking up, via a vacuum directed through the spindle, an article so that the article moves together with the spindle. A drive assembly is provided for driving the spindle linearly and rotationally (Z and θ directions) with respect to the housing within the housing, and a sealing assembly is situated between the spindle housing and the spindle for directing the vacuum through the spindle as the spindle is driven by the drive assembly. The sealing assembly includes an energy seal adapted to maintain sealed conditions between the spindle housing and the spindle while the spindle is driven. The energy seal comprises a canted-coil spring member housed within a ring member which encircles the spindle and engages the spindle and the spindle housing. The spindle may be indented or recessed to receive the ring member, which may be formed from Teflon® material while the canted-coil spring member may be formed from stainless steel. The spindle housing end may be adapted to connect to the vacuum source by a fitting member.

The drive assembly of the pick and place assembly includes a rotational or θ-axis driving assembly for rotationally driving the spindle in a θ direction and a linear or Z-axis driving assembly for linearly driving the spindle in a Z direction. The rotational driving assembly includes a first driving unit, such as a servo motor, a rotary drive gear rotated by the first driving unit, a rotary driven gear driven by the rotary drive gear and a spindle driving member coupled with the rotary driven gear and adapted to rotate the spindle with respect to the spindle housing while the spindle is driven by the linear driving assembly. In an illustrative example described, the outer surface of the spindle includes a plurality of grooves, and the spindle driving member is a ball spline nut which includes a through opening for accommodating the spindle and a retention unit for retaining a plurality of balls adapted to align in the grooves in the spindle.

The linear driving assembly includes a second driving unit, such as a second servo motor, a second drive gear driven by the second driving unit, a linearly driven gear driven by the second drive gear, and a coupling assembly for coupling the linearly driven gear with the spindle so as to drive the spindle in the Z direction together with the linearly driven gear. In the illustrative example described, the second drive gear is a helical drive gear, the linearly driven gear is a helical rack adapted to engage with the helical drive gear and the coupling assembly includes a rail coupled to the helical rack, a linear bearing slidably holding the rail and a coupling member, such as a drive dog, for coupling the rail with the spindle. The helical drive gear and the helical rack both have a tooth angle of 45 degrees.

In a further aspect of the invention, the above objectives are realized in a pick and place assembly in which a common housing acts as a spine to support or partially house a hollow spindle, and also rotational and linear driving assemblies for rotationally and linearly driving the spindle and including first and second driving units which are partially housed by the common housing and supported by the upper wall of the housing. The spindle, in turn passes through the common housing such that it is partially housed by the housing, and is driven by the rotational and linear driving assemblies with respect to the housing. The spindle furthermore is adapted to receive a head for picking up, via a vacuum directed through the spindle, an article and to move together with the spindle.

The constructions of the rotational and linear driving assemblies of the pick and place assembly in accordance with this further aspect of the invention are similar in configuration to the rotational and linear driving assemblies discussed above with respect to the first aspect of the invention. The common housing encloses the shaft of the first servo motor, the rotary drive gear, the rotary driven gear and the spindle driving member of the rotational driving assembly as well as the shaft of the second servo motor and the helical drive gear of the linear driving assembly. The helical rack of the linear driving assembly is disposed between the second servo motor and the spindle so as to engage with the helical drive gear, and the helical rack passes through the common housing such that a portion of the helical rack engaged with the helical drive gear is enclosed by the housing. The rail of the coupling assembly is fastened along a length of the helical rack such that at least one end of the rail extends outside of the housing and is fastened to the coupling member which is disposed outside of the common housing. The linear bearing is fastened to the common housing and is at least partially housed by the housing.

In yet a further aspect of the invention, the pick and place assemblies discussed above further utilize a spring assembly for eliminating axial and radial play in the helical drive gear and the shaft of the second servo motor. The spring assembly has an angular contact bearing and a spring for generating a force upon the angular contact bearing. In particular, the angular contact bearing and the spring are placed around an end portion of the shaft of the second servo motor such that the angular contact bearing floats above and compresses the spring.

BRIEF DESCRIPTION OF THE DRAWINGS

The above and other features and aspects of the present invention will become more apparent upon reading the following detailed description in conjunction with the accompanying drawings, in which.

DETAILED DESCRIPTION

Figure 1:
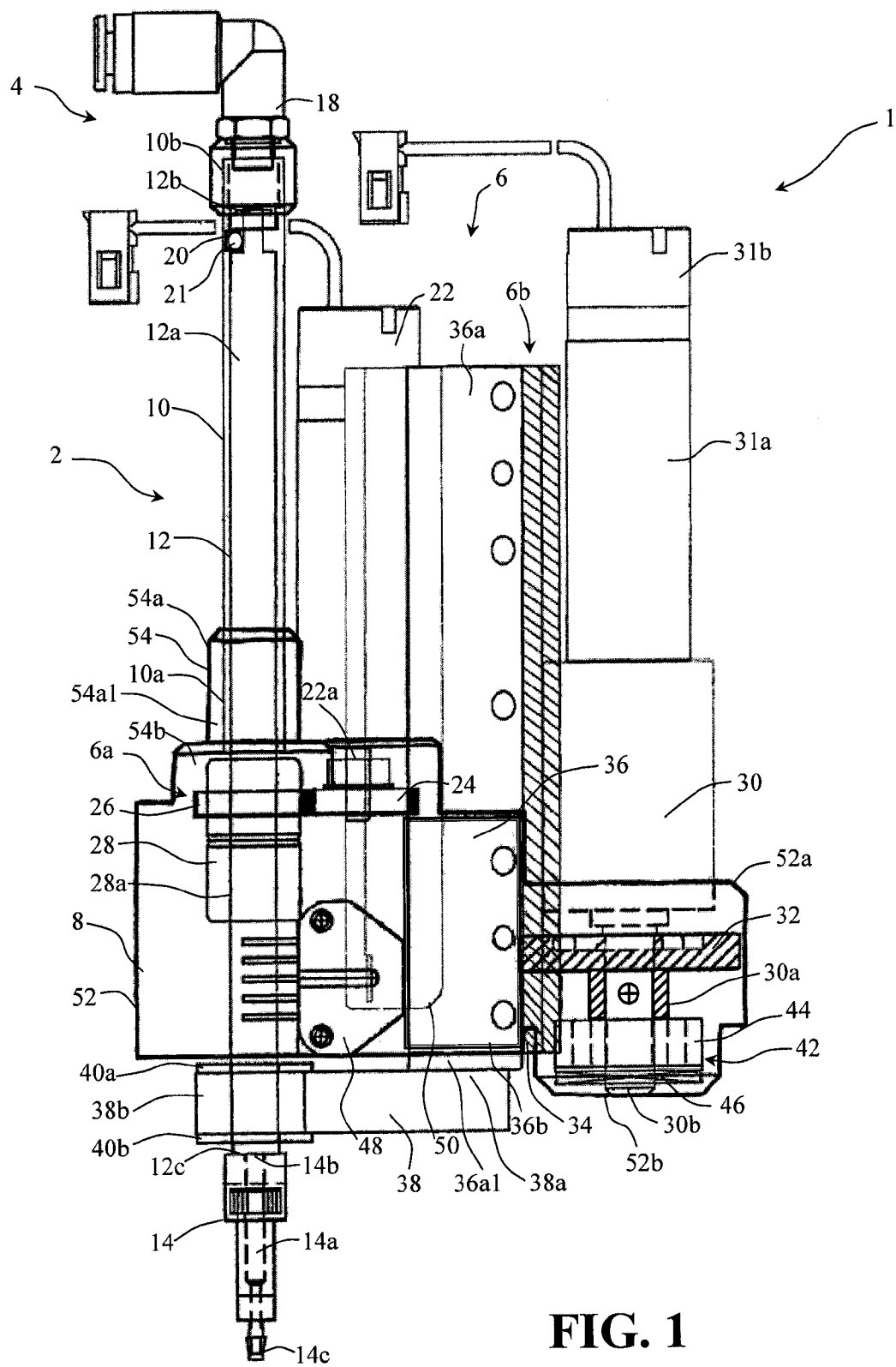
FIG. 1 shows a schematic side view of the pick and place assembly in accordance with the principles of the present invention.
Figure 2:
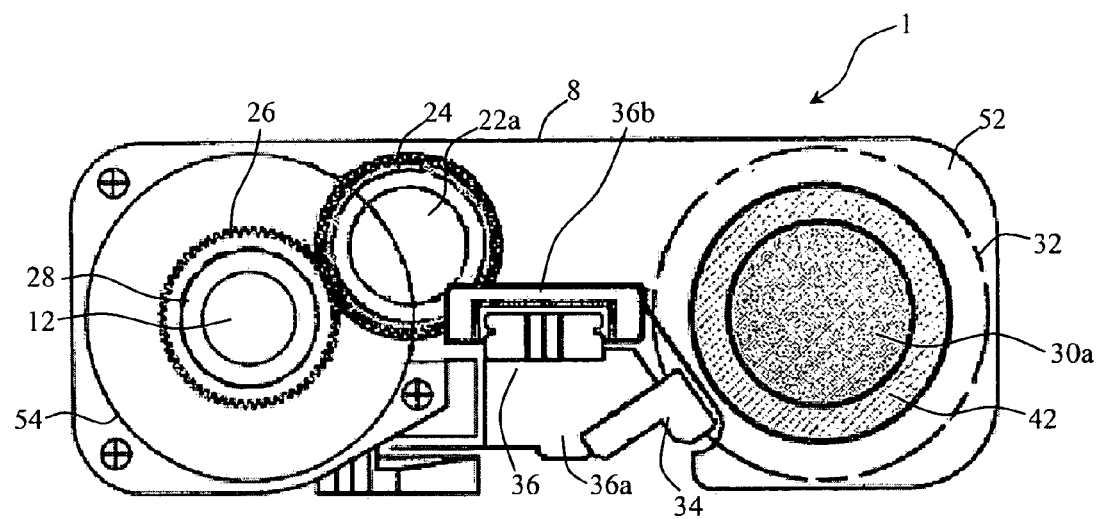
FIG. 2 shows a schematic top view of the pick and place assembly of FIG. 1.
Figure 3:
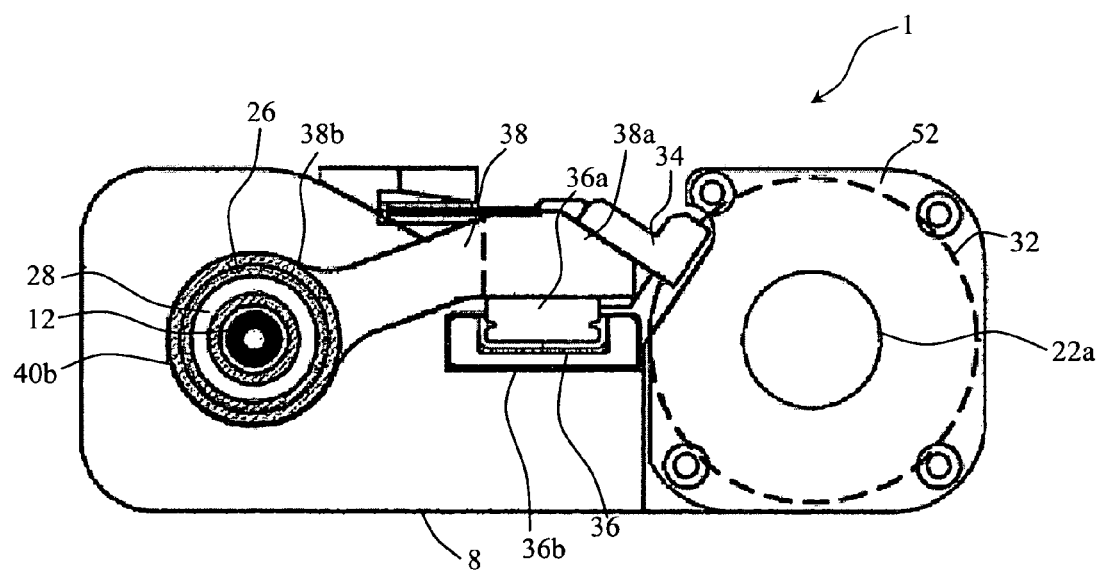
FIG. 3 shows a schematic bottom view of the pick and place assembly of FIG. 1.

FIGS. 1, 2 and 3 schematically show a side view, a top view and a bottom view, respectively of a pick and place ("PnP") assembly 1 in accordance with the principles of the present invention. As shown, the PnP assembly 1 comprises a spindle assembly 2 for picking up and placing an article, a vacuum delivery assembly 4 coupled with the spindle assembly 2 for creating a vacuum along the length of the spindle assembly 2 to enable the assembly 2 to pick up the article and a driving assembly 6 for driving the spindle assembly 2. The spindle assembly 2 and the driving assembly 6 are partially housed in and supported by a common housing 8 which forms a compact PnP unit.

Referring to FIG. 1, the spindle assembly 2 comprises a hollow spindle housing 10, also referred to as a vacuum tube, with a first end 10a of the spindle housing 10 coupled to the common housing 8 and a second end 10b coupled with the vacuum delivery assembly 4 as described in more detail herein below. The spindle assembly 2 further comprises a spindle 12, a portion of which is housed in the spindle housing 10. The spindle 12 has a substantially cylindrical hollow body construction forming a passage 12a along its length with one end of the passage forming a first opening 12b and the other end of the passage forming a second opening 12c. The first opening 12b in the spindle 12 is adapted to introduce a vacuum from the vacuum delivery assembly 4 to the passage 12a, while the second opening 12c is coupled with an adapter 14 for picking up an article. This arrangement allows the vacuum from the vacuum delivery assembly 4 to be introduced through the first opening 12b and to be conveyed through the passage 12a to the adapter 14 via the second opening 12c to enable the adapter to pick up an article.

As shown in FIG. 1, the adapter 14 is engaged with the spindle 12 and includes a through opening 14a along its length, with one end 14b of the opening 14a being aligned, and sealingly coupled, with the second opening 12c of the spindle 12. The other end 14c of the adapter includes a cup, such as a suction cup, for picking up an article without damaging the article. The adapter 14 may comprise a probe element which is detachably interconnected with the spindle 12. An example of such detachable probe element is described in a commonly owned U.S. Pat. No. 6,491,587, which is incorporated herein by reference. The detachable probe element 14 is adapted to disengage from the spindle 12 if a lateral force is applied to the adapter so as to protect the spindle 12 against damage. The use of a detachable probe element 14 also allows changing of adapters for performance of a variety of tasks.

As mentioned above, vacuum is introduced into the passage 12a of the spindle 12 of the spindle assembly 2 by the vacuum delivery assembly 4. The vacuum delivery assembly 4 includes a vacuum generator (not shown), a fitting member 18 for coupling the vacuum generator with the vacuum tube 10 of the spindle assembly 2, and a sealing member 20 for providing a seal so that the vacuum is directed to the passage 12a. The sealing member 20 comprises an energy seal 21 which is adapted to maintain a sealed condition while the spindle 12 is driven by the driving assembly 6 both rotationally and linearly relative to the vacuum tube 10.

Figure 4:
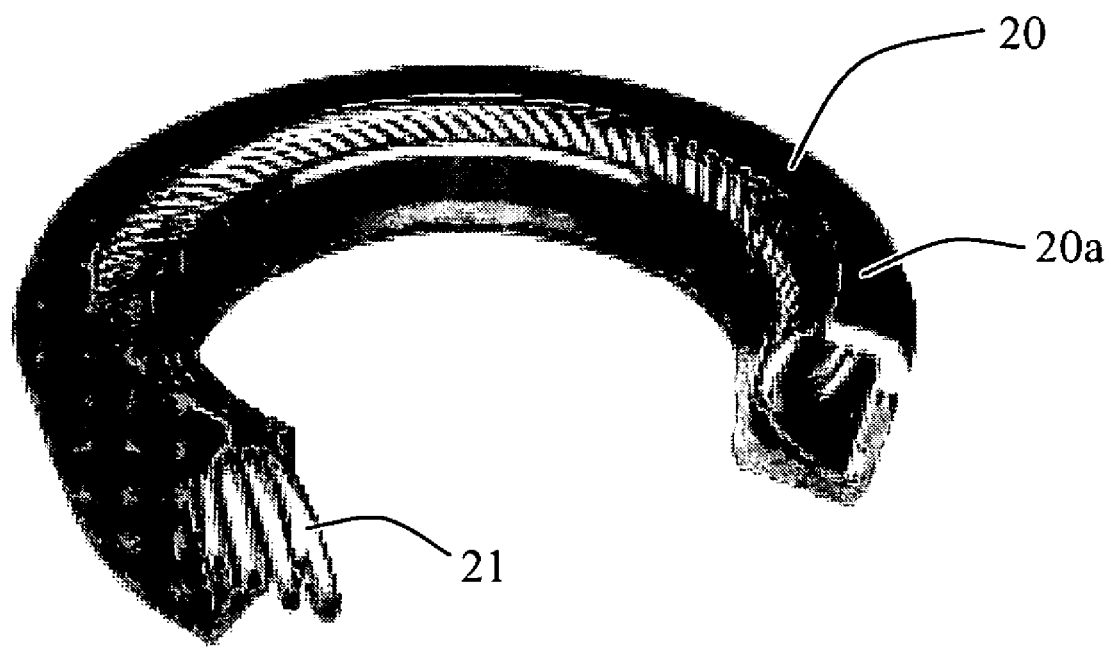
FIG. 4 shows a perspective view of a portion of an illustrative sealing member of FIG. 1.

An example of a sealing member 20 is shown in FIG. 4. In particular, FIG. 4 shows a perspective view of a portion of an illustrative sealing member 20, which includes an energy seal 21 in the form of a canted-coil spring member. The canted-coil spring member 21 is captured by or housed within a ring member 20a of the sealing member 20 and extends through the ring member's circumference. The ring member 20a may comprise Teflon® or similar materials, while the canted-coil member may comprise stainless steel, such as 316 stainless steel. The construction of the ring member 20 is such that when a force is applied to an outer or an inner circumference of the ring member 20a, the canted-coil member 21 is compressed. Compressing of the canted-coil spring member 21 causes it to deflect at a constant spring force and thus the sealing member 20 is energized. Canted-coil springs and canted-coil spring-energized seals manufactured by Bal Seal Engineering are suitable for use as the energy seal 21 and the sealing member 20, respectively, in the pick and place assembly 1 of the present invention.

Referring now back to FIG. 1, the sealing member 20 encircles the spindle 12 so as to be between and engage the spindle housing 10 and the spindle 12 in a compressed, or energized, state, thereby maintaining a sealing contact against an inner wall of the spindle housing 10 and an outer wall of the spindle 12. In the energized state, the canted-coil spring member 21 of the sealing member 20 imparts a greater sealing force than what could be attained by any of the conventional lip seals. As a result, the vacuum delivery system enjoys a significant advantage in the operating life of the sealing member 20 as compared to conventional non-energized seals.

To better accommodate and retain the sealing member 20 between the spindle housing 10 and the spindle 12, the periphery of the spindle 12 may be stepped inward such that the spindle has a reduced diameter at a position where the sealing member 20 is placed around the spindle 12. As can be seen in FIG. 1, the periphery of the spindle 12 is first stepped inward to reduce the spindle diameter and thereafter stepped in an outward direction, thus creating an indentation or recess in the periphery of the spindle 12 for accommodating the sealing member 20. In this way, the sealing member 20 is retained in the same position with respect to the spindle 12 as the spindle 12 is being driven along a Z-axis.

As shown in FIG. 1, driving assembly 6 drives the spindle 12 of the spindle assembly 2 linearly along a Z-axis and rotationally along a θ-axis. In particular, the rotary or the θ-axis motion of the spindle 12 is created by a rotary driving assembly 6a, while the linear motion, or the Z-axis motion, of the spindle 12 is created by a linear driving assembly 6b.

As shown in FIGS. 1 and 2, the rotary driving assembly 6a comprises a first driving unit 22, a rotary drive gear 24, a rotary driven gear 26 and a spindle driving member 28 for driving the spindle 12 and for coupling the driven gear 26 to the spindle 12. The first driving unit 22 preferably comprises a servo motor having a shaft 22a which rotates by the operation of the motor 22. The servo motor 22 also includes a rotary encoder (not shown) incorporated therein to control the positional feedback of the motor 22.

The motor shaft 22a is coupled to and drives the rotary drive gear 24, which in this illustrative case comprises an anti-backlash gear for eliminating lost motion. As can be appreciated, the anti-backlash drive gear 24 is split into two gear portions (not shown for purposes of simplicity and clarity) which are coupled to one another by a torsion spring. When the anti-backlash gear 24 is used as part of a gear train of the rotary driving assembly 6a, a torsional wind-up is introduced to force a zero backlash driving condition so as to ensure repeatable and accurate positioning of the spindle 12 when it is driven along the θ-axis.

As shown in FIGS. 1 and 2, the rotary drive gear 24 is placed around the motor shaft 22a so that the drive gear 24 rotates together with the motor shaft 22a when the motor 22 is operating. In particular, when, as in the present illustrative case, the anti-backlash gear is used as the rotary drive gear 24, the first gear portion of the anti-backlash gear 24 is directly coupled with the motor shaft 22a, while the other portion is torsionally coupled to the first gear portion by the torsion spring. When the rotary drive gear 24 is driven by the rotation of the shaft 22a, the drive gear 24 interacts with the rotary driven gear 26 so as to drive the driven gear 26. In the present illustrative arrangement, the rotary drive gear 24 and the rotary driven gear 26 are spur gears, each comprising a toothed wheel member. In the case of the anti-backlash gear 24, the gear portions of the gear 24 comprise like toothed wheel members, which are aligned and coupled to one another. As is well understood, the teeth of the first drive gear 24 mate with the teeth of the first driven gear 26 so that the drive gear 24 transmits torque to the driven gear 26, thereby creating the rotary motion of the gear 26 in a direction which is opposite to that of the rotary drive gear 24.

The rotary driven gear 26 is coupled with the spindle driving member 28 and drives the spindle driving member 28 when torque is exerted on the driven gear 26 by the drive gear 24. As shown in FIGS. 1 and 2, the driven gear 26 is placed around, and pressed onto, the spindle driving member 28 such that the member 28 rotates together with the driven gear 26.

In the illustrative case shown in FIG. 1, the spindle driving member 28 is a ball spline nut with a through opening 28a along its length for accommodating the spindle 12, which is used as a spline shaft. In particular, an outer surface of the spindle 12 includes a plurality of cylindrically shaped groves extending along the length of the spindle 12. In the present illustrative example, the spindle 12 includes two cylindrically shaped grooves. The ball spline nut 28 includes a ball retention unit (not shown) for holding in place a plurality of balls (not shown). The ball retention unit includes a plurality of cylindrically shaped grooves which are aligned with the groves in the spindle 12. When the spindle 12 is inserted into the opening 28a of the ball spline nut 28, the balls are aligned in the groves formed on the outer surface of the spindle 12 and in the retention unit. This arrangement allows the ball spline nut 28 to be rotated together with the spindle 12, while allowing simultaneous linear Z-axis movement of the spindle 12 with respect to the ball spline nut 28. An example of a spindle driven by a ball spline unit is disclosed in U.S. Pat. No. 6,464,069, which assigned to the same assignee herein and is incorporated by reference into the present application.

With the above-described arrangement, the drive gear 24 drives the rotary driven gear 26 which rotates the ball spline nut 28 and the spindle 12 about the θ-axis. The rotation, or θ-axis movement, of the spindle 12 causes the adapter 14 coupled to the spindle 12 to rotate or undergo θ-axis movement together with the spindle 12. The orientation of an article picked up by the spindle assembly 2 and held by the adapter 14 of the assembly 2, can thus be controlled to undergo similar rotation or θ-axis movement.

As mentioned above, the linear motion, i.e. along the Z-axis, of the spindle 12 is carried out by the linear driving assembly 6b. As shown in FIG. 1, the linear driving assembly 6b comprises a second driving unit 30, a drive gear 32 coupled to the second driving unit 30, a linearly driven unit 34 which is driven along the Z-axis by the drive gear 32, a linear drive adapter 36 for the linearly driven unit 34, and a coupling member 38 for coupling the linearly driven unit 34 and the adapter 36 with the spindle 12 of the spindle assembly 2. The driving unit 30, which is preferably a servo motor 30, includes a shaft 30a rotated by the motor's operation. The drive gear 32 is coupled to the shaft 30a and, as shown in FIGS. 1-3, is placed around the shaft 30a, so that it is rotated together with the shaft 30a when the motor 30 is operated.

As discussed above, the drive gear 32 is adapted to drive the linearly driven gear 34. In this case, the linearly driven gear 34 and the drive gear 32 are formed as a rack and pinion arrangement so as to convert rotational motion of the motor shaft 30a into linear motion along the Z-axis. In the present illustrative example, the drive gear 32 is preferably a helical drive gear formed as a toothed wheel with its teeth cut at a predetermined angle. The linearly driven gear 34 comprises a helical rack including a plurality of teeth cut at the angle corresponding to the predetermined angle of the helical drive gear 32 and adapted to be engaged with the teeth of the helical gear 32. In this illustrative example, the predetermined angle of the teeth of the helical drive gear 32 and the helical rack 34 is 45 degrees.

When the motor 30 operates to rotate the motor shaft 30a and the helical drive gear 32 coupled to the motor shaft 30a, the helical gear 32 exerts a torque on the helical rack 34 so as to drive the rack 34 linearly along the Z-axis. The helical rack 34 is coupled to an adapter 36 which constrains the motion of the rack 34 to straight line Z-axis motion. As shown in FIGS. 1-3, the adapter 36 comprises a rail 36a and a linear bearing 36b. In particular, the helical rack 34 is affixed to the rail 36a, which, in turn, is movably held within the linear bearing 36b. In this way, when the helical drive gear 32 drives the helical rack 34, the rail 36a and the helical rack 34 affixed thereto move along the Z-axis within the linear bearing 36b, which remains stationary with respect to the PnP assembly 1.

The rail 36a of the adapter 36 is fastened to the coupling member 38 which is coupled to the spindle 12 so that the linear motion of the rail 36a and the helical rack 34 is transmitted via the coupling member 38 to the spindle 12. As shown in FIG. 1, the coupling member 38 is a drive dog coupler having a first end 38a thereof fastened to the rail 36a of the adapter 36 and a second end 38b thereof coupled to the spindle 12 such that the linear motion is transmitted to the spindle 12 while simultaneously allowing the spindle to rotate.

In the present illustrative example, the first end 38a of the drive dog coupler 38 is bolted or pressed onto to a lower end portion 36a1 of the rail 36a, and the second end 38b of the drive dog coupler 38 forms a loop end portion 38b which surrounds the spindle 12. Radial bearings 40a, 40b are disposed on the outer surface of the spindle 12 and are fastened thereto such that at least one radial bearing 40a, 40b is positioned above and below the loop end portion 38b of the drive dog coupler 38. The outer periphery of the radial bearings 40a, 40b is greater than a through opening formed in the loop end portion 38b of the drive dog coupler 38. In this way, when the rail 36a linearly drives the drive dog coupler 38 in a downward direction, the loop end portion 38b exerts a downward force on the radial bearing 40b, thus causing the spindle 12 to move downwardly. Similarly, when the drive dog coupler 38 is driven in an upward direction, the loop end portion 38b exerts an upward force on the radial bearing 40a so as to drive the spindle 12 upwardly.

The linear driving assembly 6b also includes a spring assembly 42 for eliminating any axial or radial play in the helical drive gear 32 and the motor 30. The spring assembly 42 comprises an angular contact bearing 44 and a wave spring 46 generating a force upon the angular contact bearing 44. In the arrangement shown in FIG. 1, the angular contact bearing 44 and the wave spring 46 are placed around an end portion 30b of the motor shaft 30a such that the angular contact bearing 44 floats above and compresses the wave spring 46. The forces generated by the compressed wave spring 46 on the angular contact bearing 44 counteract the axial and radial forces generated when the helical drive gear 32 is driven by the motor shaft 30a, thus eliminating axial and radial play by the linear driving assembly 6b.

The driving operation of the motor 30 of the linear driving assembly 6b is controlled by a gear box 31a and an encoder 31b. In particular, the gear box is a planetary gear box having a gear ratio of 24:1 to provide resistance against backdriving, i.e. driving or rotation of the shaft 30a in a reverse direction. In addition, the planetary gearbox multiplies the driving torque to allow accommodation of a working payload. An encoder of a rotary design may be mounted on the motor 30 so as to control the amount of rotation by the shaft 30a, and thus the corresponding amount of linear displacement of the spindle 12. Because the encoder count is multiplied by 24 corresponding to the gear ratio of the gear box, this arrangement provides a very fine resolution, i.e. in microns, for the linear movement of the spindle 12. In addition, this arrangement, in combination with the sealing member 20 of the vacuum delivery assembly 4, provides protection against free fall of the spindle 12 such that the spindle will remain in its last position in case of a power failure.

The positional feedback of both the rotary driving assembly 6a and the linear driving assembly may be also controlled by a linear encoder having a linear read head 48 and a scale 50. In particular, in a typical linear encoder, the read head 48 is intersected by a linear scale 50 to generate positional information.

As mentioned above, a portion of the spindle assembly 2 and a portion of the driving assembly 6 are housed and supported by the integrated housing 8 so as to form a compact PnP assembly 1. As shown in FIG. 1, the integrated housing 8 comprises a spine 52 and an vacuum tube adapter 54 fastened to the spine 52 by a conventional fastening means such as by pressing the vacuum tube adapter 54 onto the spine 52. As discussed in more detail below, the vacuum tube adapter 54 encloses an end portion 10a of the vacuum tube 10 of the spindle assembly 2 as well as a portion of the rotary driving assembly 6a.

The vacuum tube adapter 54 comprises a hollow member having a top portion 54a and a lower portion 54b. The top portion 54a of the adapter 54 comprises a substantially cylindrical hollow body which includes a through opening 54a1. The end portion 10a of the vacuum tube 10 is inserted into the through opening 54a1 and, in the illustrative case shown, the end portion 10a of the tube 10 is press-fitted into the top portion 54a of the adapter 54. As also shown, the end portion 10a of the tube 10 extends slightly beyond the top portion 54a and into the lower portion 54b of the adapter 54.

As shown in FIG. 1, the lower portion 54b of the vacuum tube adapter 54 is also substantially cylindrical and has a greater periphery, or diameter, than the top portion 54a. The lower portion 54b of the vacuum tube adapter 54 houses therein the rotary driven gear 26 and a portion of the spindle driving member 28. The lower portion 54b is fastened to the spine 52 using a plurality of bolts or other suitable conventional fastening means so as to form a continuous housing unit.

The spine 52 of the integrated housing 8 forms a main body and a substantial portion of the integrated housing 8. The spine 52 comprises a hollow body with a cavity supporting and housing therein the motor shafts 22a and 30a of the first and second motors 22, 30, the rotary drive gear 24, a portion of the spindle driving member 28 not enclosed by the vacuum tube adapter 54, the linear drive gear 32, at least a portion of the linear bearing 36b of the linear drive adapter 36 and the spring assembly 42. The spine 52 also houses and supports the linear read head 48 and at least a portion of the scale 50 for controlling the positional feedback of the driving assemblies 6a, 6b. As can be appreciated, the shape of the spine 52 is not limited to the shape shown in FIG. 1 and may be varied depending on the size and shape of the components of the driving assemblies 6a, 6b so as to form an integrated and compact unit.

Referring to FIG. 1, each of the motors 22, 30 is supported by and fastened to the spine 52 so that its respective motor shaft 22a, 30a extends into the spine cavity, and is enclosed by the spine 52. In FIG. 1, each motor 22, 30 is supported by and fastened to an upper wall 52a of the spine 52, with the first motor 22 being positioned in close proximity with the spindle 12 so that the rotary drive unit 24 placed around the shaft 22a can engage with and drive the rotary driven unit 26 around the spindle driving member 28. As shown in FIG. 1, the motor shaft 22a of the first motor 22 is housed by the spine 52 such that the rotary drive gear 24 placed around the shaft 22a resides within the spine 52 cavity. As also shown, the spindle 12, which is partially housed by the vacuum tube 10, passes through the vacuum tube adapter 54 and the spine 52, which support the spindle 12 and constrain its movement with respect to the integrated housing 8 to the linear Z-axis and rotary θ-axis motions.

The motor shaft 30a of the second motor 30 also extends into the spine cavity from the upper wall 52a of the spine 52 and to an opposing lower wall 52b of the spine. As shown in FIG. 1, the linear drive gear 32 and the spring assembly 42 positioned around the motor shaft 30a are supported and enclosed by the spine 52, such that the lower wall 52b of the spine 52 provides support for the wave spring 46 of the spring assembly 42. As can be seen in FIG. 1, a portion of the spine cavity which houses the spring assembly 42 may be shaped to conform to the shape of the spring assembly 42 in order to further assist in minimizing any axial play of the helical drive gear 32.

As also shown, the helical rack 34 and the linear drive adapter 36 are disposed between the second motor 30 and the spindle 12. In particular, the helical rack 34 is positioned adjacent to the second motor 30 so that a toothed surface of the rack 34 can engage with the teeth of the helical gear 32 fastened around and driven by the motor shaft 30a, and the rail 36a of the linear drive adapter 36 is affixed to the opposing side of the helical rack 34. The rail 36a and the helical rack 34 are supported by and pass through the spine 52, and move linearly with respect to the spine 52 when driven by the helical gear 32. In particular, the rail 36a and the helical rack 34 enter the spine cavity through the upper wall 52a and pass through the cavity where the rack 34 is engaged with the helical gear 32. The rack 34 and the rail 36a then exit the spine cavity through the lower wall 52b of the spine 52 with the end portion 36a1 of the rail 36a being fastened to the drive dog coupler 38 outside of the spine 52. As can be appreciated, when the rail 36a and the helical rack 34 move in relation to the spine 52, the portion of the helical rack 34 engaged with the helical gear 32 remains enclosed by the spine 52 so as to avoid any external interference with the operation of the linear driving assembly 6a.

As also discussed above, the rail 36a moves within the linear bearing 36b which prevents axial movement of the rail 36a and limits the movement of the rail 36a and the helical rack 34 to the Z-axis linear motion. The linear bearing 36 remains stationary with respect to the spine 52 and is fastened to the spine 52 by a conventional means, such as one or more bolts. The spine 52 houses at least a portion of the bearing 36b, and in the illustrative example shown in FIG. 1, the linear bearing 36b is substantially housed by the spine, such that one end of the bearing 36b is aligned with the outer periphery of the upper spine wall 52a and the opposing end of the bearing 36 is aligned with outer periphery of the lower wall 52b of the spine 52.

As shown in FIG. 1, the spine 52 may be formed as a one-piece hollow body. In the alternative, the spine 52 may be formed from a plurality of parts fastened to one another by a conventional means. For example, the spine 52 may comprise a cap-shaped unit for enclosing and supporting the spring assembly 42. In an alternative arrangement, the common housing 8 may be formed as a single continuous unit.

In all cases it is understood that the above-described arrangements are merely illustrative of the many possible specific embodiments which represent applications of the present invention. Numerous and varied other arrangements can be readily devised in accordance with the principles of the present invention without departing from the spirit and scope of the invention, as defined by the accompanying claims.

I claim:

1. An assembly for use in a device for picking up and positioning an article, said assembly comprising:
   a hollow spindle housing adapted at one end to be connected to a vacuum source;
   a hollow spindle housed in said spindle housing, said hollow spindle having an open first end situated at and enclosed by said hollow spindle housing, and a second end adapted to receive a head for picking up, via a vacuum directed through said spindle, an article so that the article moves together with the spindle;
   an assembly for driving said spindle in linear and rotational directions with respect to the housing within said housing; and
   a sealing assembly situated between said hollow spindle housing and said hollow spindle at a point along the length of said hollow spindle adjacent to and spaced from the open first end of said hollow spindle for directing the vacuum through the hollow spindle as the hollow spindle is driven by said driving assembly.

2. An assembly in accordance with claim 1, wherein said sealing assembly includes an energy seal adapted to maintain sealed conditions between the spindle housing and the spindle while the spindle is driven by the driving assembly.

3. An assembly in accordance with claim 2, wherein said energy seal comprises a canted-coil spring member and said sealing assembly further includes a ring member for housing said canted-coil spring member.

4. An assembly in accordance with claim 3, wherein: said spindle has an indentation and said ring member encircles said spindle in said indentation so as to engage said spindle and said spindle housing.

5. An assembly in accordance with claim 4, wherein said canted-coil spring member comprises stainless steel; and said ring member comprises Teflon®.

6. An assembly in accordance with claim 3, wherein one end of said spindle housing is adapted to be connected to the vacuum source by a fitting member.

7. An assembly in accordance with claim 2, wherein:
   said driving assembly comprises a rotational driving assembly for driving said spindle in said rotational direction and a linear driving assembly for driving the spindle in said linear direction;
   said rotational driving assembly comprises a first driving unit, a rotary drive gear rotated by said first driving unit, a rotary driven gear driven by said rotary drive gear and a spindle driving member coupled with the rotary driven gear and adapted to rotate said spindle with respect to the spindle housing while the spindle is driven by the linear driving assembly; and
   said linear driving assembly comprises a second driving unit, a second drive gear driven by the second driving unit, a linearly driven gear driven by the second drive gear, and a coupling assembly for coupling the linearly driven gear with the spindle so as to drive the spindle in the said linear direction together with the linearly driven gear.

8. An assembly in accordance with claim 7, wherein:
   an outer surface of said spindle includes a plurality of grooves, said first driving unit is a servo motor including a shaft for driving the rotary drive gear, and said spindle driving member is a ball spline nut including a through opening for accommodating the spindle and a retention unit for retaining a plurality of balls adapted to align in the groves in said spindle.

9. An assembly in accordance with claim 7, wherein:

said second driving unit is a servo motor including a shaft for rotating the second drive gear;

said second drive gear is a helical drive gear with a predetermined tooth angle;

said linearly driven gear is a helical rack having the predetermined tooth angle and adapted to engage with said helical drive gear; and said coupling assembly comprises a rail coupled to said helical rack and slidably held within a linear bearing, and a coupling member for coupling the rail with the spindle.

10. An assembly in accordance with claim 9, wherein said predetermined tooth angle is 45 degrees.

11. An assembly in accordance with claim 2, further comprising a head for picking up an article, said head being detachably interconnected with said end of said spindle.

12. An assembly in accordance with claim 1, further comprising:

a common housing for supporting and partially housing said spindle, said rotational driving assembly and said linear driving assembly.

13. An assembly in accordance with claim 12, wherein:

said rotational and linear driving assemblies include first and second driving units; and each of said first and second driving units is partially housed in said common housing and supported by an upper wall of said housing.

14. An assembly in accordance with claim 12, wherein:

said linear driving assembly comprising a motor having a shaft, a helical drive gear coupled with and driven by said shaft, a helical rack driven by said helical drive gear and a coupling assembly for coupling said helical rack with said spindle so as to drive said spindle in a linear direction while said spindle is being driven in a rotational direction by said rotational driving assembly; and said assembly further comprises a spring assembly for eliminating axial and radial play by said shaft and said helical drive gear.

15. An assembly in accordance with claim 14, wherein:

said spring assembly comprises an angular contact bearing and a spring, wherein said contact bearing and said spring are disposed around said shaft such that said angular contact bearing floats above said spring.

16. An assembly for use in a device for picking up and positioning an article, said assembly comprising:

a spindle, one end of the spindle being adapted to receive a head for picking up an article;

a hollow spindle housing for housing said spindle;

a rotational driving assembly for driving the spindle in a rotational direction, said rotational driving assembly including a first driving unit;

a linear driving assembly for driving the spindle in a linear direction, said linear driving assembly including a second driving unit; and a common housing for supporting and partially housing said spindle, said rotational driving assembly and said linear driving assembly;

wherein said common housing includes a spine and a spindle housing adapter for enclosing one end of said spindle housing.

17. An assembly in accordance with claim 16, wherein:

each of said first and second driving units is partially housed by said housing and supported by an upper wall of said common housing.

18. An assembly in accordance with claim 17, wherein said rotational driving assembly further comprises a rotary drive gear coupled with and rotated by the first driving unit, a rotary driven gear driven by said rotary drive gear and a spindle driving member coupled with the rotary driven gear and adapted to rotate the spindle with respect to the spindle housing while the spindle is driven by the second driving assembly.

19. An assembly in accordance with claim 18, wherein:

an outer surface of said spindle includes a plurality of groves;

said first driving unit is a servo motor including a shaft, said rotary drive gear being coupled with said shaft, and said spindle driving member comprises a ball spline nut including a through opening for accommodating the spindle and a ball retention unit for retaining a plurality of balls adapted to align in the grooves in the spindle.

20. An assembly in accordance with claim 19, wherein said shaft of said first servo motor, said rotary drive gear, said rotary driven gear and said spindle driving member are enclosed by said common housing.

21. An assembly in accordance with claim 16, wherein said rotational driving assembly further comprises a second drive gear driven by the second driving unit, a linearly driven gear driven by the second drive gear, an adapter coupled with the linearly driven gear and a coupling member for coupling said adapter with said spindle.

22. An assembly in accordance with claim 21, wherein:

said second driving unit is a servo motor including a shaft for rotating the second drive gear, said second drive gear is a helical drive gear with a predetermined tooth angle, said linearly driven gear is a helical rack adapted to engage with the helical drive gear and having the predetermined tooth angle;

said adapter comprises a rail coupled with the helical rack and a linear bearing for slidably holding the rail; and one end of said coupling member coupled with said rail and the other end of said coupling member coupled with the spindle so as to drive said spindle in the rotational direction while said spindle is driven by said rotational driving assembly.

23. An assembly in accordance with claim 22, wherein said predetermined tooth angle is 45 degrees.

24. An assembly in accordance with claim 23, wherein said shaft of said second servo motor and said helical drive gear are enclosed by said common housing, and wherein said helical rack is disposed between said second servo motor and said spindle so as to engage with said helical drive gear, said helical rack passing through said common housing such that a portion of said helical rack engaged with said helical drive gear is enclosed by said common housing.

25. An assembly in accordance with claim 24, wherein said rail is fastened along a length of said helical rack such that at least one end of said rail extends beyond said common housing, and wherein said end of said rail is fastened to said coupling member, said coupling member being disposed outside of said common housing.

26. An assembly in accordance with claim 25, wherein said common housing houses at least a portion of said linear bearing and said linear bearing is fastened to said common housing.

27. An assembly in accordance with claim 22, further comprising a spring assembly for eliminating axial and radial play in said helical drive gear and said shaft of said second servo motor, said spring assembly comprising an angular contact bearing and a spring for generating a force upon said angular contact bearing.

28. An assembly in accordance with claim 27, wherein said angular contact bearing and said spring are placed around an end portion of said shaft of said second servo motor such that said angular contact bearing floats above and compresses said spring.

29. An assembly in accordance with claim 16, wherein said spindle passes through said common housing, said rotational driving assembly drives said spindle in a rotational direction with respect to said housing and said linear driving assembly driving said spindle in a linear direction with respect to said housing.

30. An assembly in accordance with claim 16, wherein said linear driving assembly further comprises a gear box having a predetermined gear ratio so as to provide resistance against driving said second driving unit in a reverse direction and multiplying of motor torque to accommodate a working payload, and an encoder for controlling a driving amount by said second driving unit.

31. An assembly in accordance with claim 30, wherein said predetermined gear ratio of said gear box is 24:1.

32. An assembly in accordance with claim 16, wherein said spindle housing adapter houses therein said rotary driven gear and a portion of said spindle driving member, and wherein said spine houses therein the rotary driven gear and the other portion of said spindle driving member.

33. An assembly for use in device for picking up and positioning an article, said assembly comprising:
    a spindle, one end of the spindle being adapted to receive a head for picking up an article;
    a rotational driving assembly for driving said spindle in a rotational direction;
    a linear driving assembly for driving said spindle in a linear direction, said linear driving assembly comprising a motor having a shaft and a helical drive gear coupled with and driven by said shaft; and
    a spring assembly for eliminating axial and radial play by said shaft and said helical drive gear and comprising a contact bearing and a spring, wherein said contact bearing and said spring are disposed around said shaft such that said angular contact bearing floats above said spring.

34. An assembly in accordance with claim 33, wherein:
    said linear driving assembly further comprises: a helical rack driven by said helical drive gear and a coupling assembly for coupling said helical rack with said spindle so as to drive said spindle in a linear direction while said spindle is being driven in a rotational direction by said rotational driving assembly; and
    said spring assembly further comprises and a contact bearing and a spring, wherein said contact bearing and said spring are disposed around said shaft such that said angular contact bearing floats above said spring.

* * * * *